(12) United States Patent  (10) Patent No.: US 7,337,083 B2
Arnoux et al.  (45) Date of Patent: Feb. 26, 2008

(54) PROCESS FOR IDENTIFICATION OF THE DIRECTION OF ROTATION OF TWO PERIODIC ELECTRICAL SIGNALS AT THE SAME FREQUENCY

(75) Inventors: Daniel Arnoux, Paris (FR); Axel Arnoux, Paris (FR); Jean Kressic, Paris (FR)

(73) Assignee: Chauvin Arnoux, Paris (FR)

( * ) Notice: Subject to any disclaimer, the term of this patent is extended or adjusted under 35 U.S.C. 154(b) by 111 days.

(21) Appl. No.: 10/873,637

(22) Filed: Jun. 23, 2004

(65) Prior Publication Data

US 2005/0038617 A1  Feb. 17, 2005

(30) Foreign Application Priority Data

Jun. 24, 2003 (EP) ................... 03291549

(51) Int. Cl.
  *G06F 19/00* (2006.01)
  *G01R 25/00* (2006.01)
(52) U.S. Cl. .......................... 702/79; 324/86
(58) Field of Classification Search ................. 702/79, 702/72, 73; 324/86, 76.77; 361/85; 331/11, 331/25, 27, 32
  See application file for complete search history.

(56) References Cited

U.S. PATENT DOCUMENTS

| 3,663,956 | A | * | 5/1972 | Purdy et al. ............. 324/76.82 |
| 4,400,667 | A | * | 8/1983 | Belkin ........................ 331/1 A |
| 4,495,461 | A |  | 1/1985 | Gilliam |
| 4,535,459 | A | * | 8/1985 | Hogge, Jr. ................... 375/324 |
| 4,698,601 | A | * | 10/1987 | Aizawa ....................... 331/1 A |
| 4,845,685 | A | * | 7/1989 | Wechsler et al. ............. 367/97 |
| 5,117,135 | A | * | 5/1992 | Lee et al. ....................... 327/7 |
| 5,126,602 | A | * | 6/1992 | Lee et al. ...................... 327/10 |
| 5,159,279 | A | * | 10/1992 | Shenoi et al. ................... 327/2 |
| 5,248,969 | A | * | 9/1993 | Lee et al. ...................... 341/73 |

(Continued)

FOREIGN PATENT DOCUMENTS

BE  1 001 712  2/2001

(Continued)

OTHER PUBLICATIONS

Carty, Leuridan; "Phase-reversal protector trips main contactor", *Electronics Intl.*, vol. 55, p. 173 (1982).

(Continued)

*Primary Examiner*—John Barlow
*Assistant Examiner*—Toan M. Le
(74) *Attorney, Agent, or Firm*—Leydig, Voit & Mayer, Ltd.

(57) ABSTRACT

A process and apparatus for identification of the direction of rotation of two periodic electrical signals present on two electrical conductors, particularly of a three-phase power system. In this process, the signals are sampled from two conductors by two wires of the test apparatus provided with a connection to ground via a user of the apparatus. The direction of rotation is determined from information provided by the two signals. The direction of rotation is determined during the zero-crossing of the voltage between the two phase signals. The invention can be used in a apparatus for testing of the direction of rotation of the phases of a three-phase network.

14 Claims, 2 Drawing Sheets

U.S. PATENT DOCUMENTS

| | | | |
|---|---|---|---|
| 5,293,113 A | | 3/1994 | Beha et al. |
| 5,436,598 A | * | 7/1995 | Harris .................. 331/11 |
| 5,525,935 A | * | 6/1996 | Joo et al. ............... 331/11 |
| 5,799,048 A | * | 8/1998 | Farjad-Rad et al. ..... 375/360 |
| 6,144,925 A | * | 11/2000 | Hofstetter ............. 702/72 |

FOREIGN PATENT DOCUMENTS

| | | |
|---|---|---|
| DE | 40 02 603 | 8/1991 |
| DE | 298 15 829 | 3/1999 |
| GB | 2 091 961 | 8/1982 |

OTHER PUBLICATIONS

Palihawadana, C; "Monitor Shows Three-Phase Sequence", *Electronics World and Wireless World*, Reed Business Pub., vol. 100, No. 1700, p. 602, (Jul. 1, 1994).

* cited by examiner

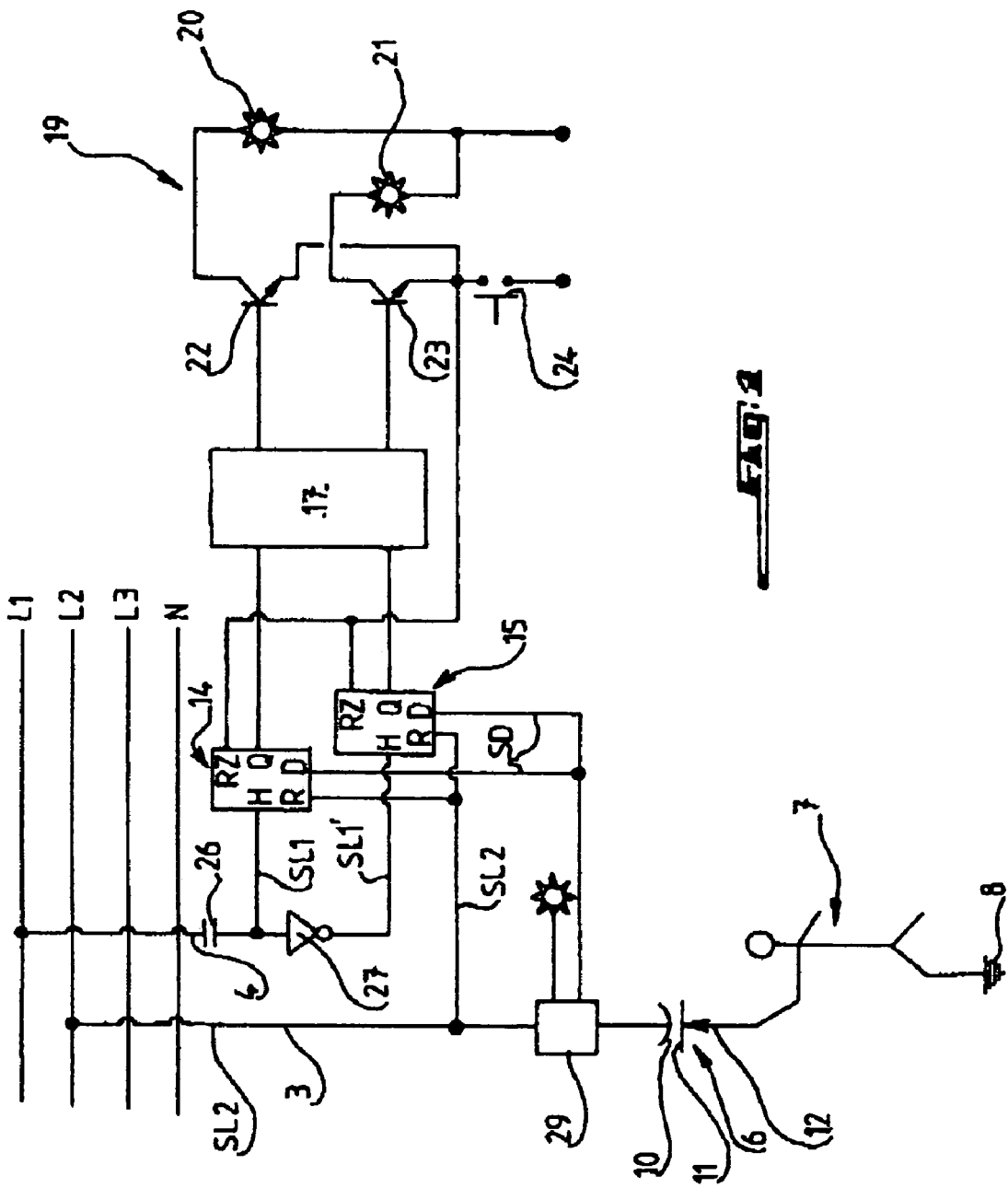

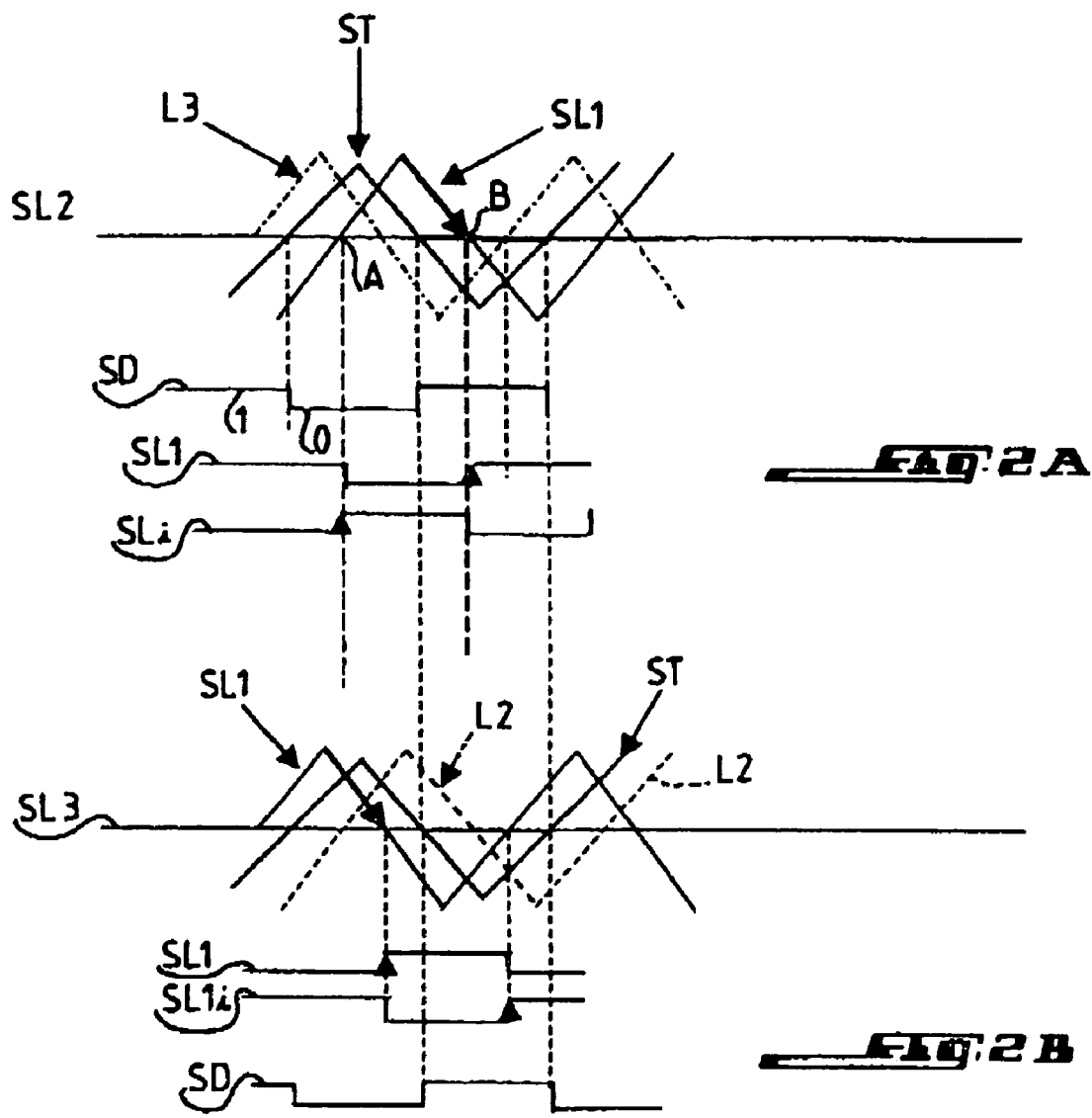

PROCESS FOR IDENTIFICATION OF THE DIRECTION OF ROTATION OF TWO PERIODIC ELECTRICAL SIGNALS AT THE SAME FREQUENCY

FIELD OF THE INVENTION

The invention concerns a process for identification of the direction of rotation of two periodic electrical signals at the same frequency, each present on an electrical conductor, particularly of a three-phase voltage system, according to which signals are sampled from the two conductors, and the direction of rotation is determined by placing the sampled signals in relation with the aid of a device connected to ground via the user of the device. The invention also concerns an apparatus for implementation of this process.

BACKGROUND

There is a known process which is based on the use of two wires connected only to two phases and of a contact electrode for application by a finger of the user. This process involves the use of a dividing bridge essentially made up of resistors and presents an inconvenience if insulating gloves are worn. Furthermore, the capacitive connection to the user causes a phase shift which gives a false reading. Moreover, it cannot be assured that the electrical reference of the system, even without gloves, is ground potential. For the safety of the user, there is no insulation but only current limiting, which is only effective under normal conditions of use.

Another known process uses two wires with storage of one phase, which is compared to another phase, upon opening of a time window. This process has the disadvantage of requiring operation in a very short time on a network and does not function correctly on generating units because of the instability. Furthermore, it only functions over a very reduced range of frequencies, and it is necessary to be able to differentiate the neutral phases in order to avoid erroneous readings of the direction of rotation due to a poor connection.

SUMMARY OF THE INVENTION

The invention provides a process and an apparatus which mitigate the disadvantages of the aforementioned prior art.

To realize this goal, in the process according to the invention the direction of rotation of the phases is determined during the zero-crossing of the voltage which exists between these two phases.

According to a characteristic of the invention, one of the two phases is connected to the internal ground in order to serve as a voltage reference, and the sampling of the signal from the other phase is done via a capacitive connection intended for compensating for the phase shift induced by the capacitor for connection to ground via the user.

BRIEF DESCRIPTION OF DRAWINGS

The invention will be better understood and other aims, characteristics, details and advantages thereof will appear more clearly in the course of the following explanatory description with reference to the appended drawings, given only by way of example, illustrating an embodiment of the invention and in which:

FIG. 1 is a schematic block diagram of the apparatus for implementation of the process according to the invention, and FIGS. 2A and 2B illustrate two variants of the steps of the process according to the invention and of the functioning of the apparatus for implementation of this process.

DETAILED DESCRIPTION

In the schematic diagram of FIG. 1, references L1, L2 and L3 indicate the three phase conductors of a three-phase network, whose direction of rotation is to be determined by means of an apparatus according to the invention, which is designated by general reference 1. The neutral of the network, designated N, remains unconnected in the context of the invention.

The apparatus according to the invention has two wires 3, 4 for sampling of the electrical signals from phase conductors L1 to L3, each wire ending with a sampling or contact point in a known manner, constituting an input of the apparatus. In the case of FIG. 1, given by way of example, wires 3 and 4 are connected to phases L1 and L2, and the task of the apparatus is therefore to establish the direction of rotation of these two phases in the three-phase system represented containing the three phases L1 to L3. The apparatus, moreover, has contact zone 6 for application of a finger of the user, as illustrated by the diagrammatic representation of user 7, shown standing on the ground, which is indicated by 8.

More precisely, the apparatus has a capacitor for connection to ground 8, formed by metal element 10 arranged inside the housing of the apparatus, a certain distance from the wall, indicated diagrammatically by 11, of this housing. At the level of element 10, on the exterior surface of wall 11, the housing has a contact zone indicated by 12. Wall 11 of the housing and the air gap between it and metal element 10 serve as a dielectric for the connection capacitor.

Apparatus 1 also has two D flip-flops 14 and 15 which are intended for determining the rotation of the two phases selected, phases L1 and L2 in the example represented. The Q outputs of flip-flops 14 and 15 are connected via Exclusive-OR logic gate 17 to display device 19 with two indicator lights 20, 21, advantageously in the form of light-emitting diodes (LEDs), indicator light 20 being intended for displaying the state of Q output of flip-flop 14, and indicator light 21, the state of the Q output of flip-flop 15. Each of the two indicator lights 20, 21 is respectively connected to the collector of transistor 22, 23, interconnected emitters of which are connected via single-pole, single-throw switch 24 to one potential of the electrical power source of display device 19.

According to an essential characteristic of the invention, one of the phases, phase L1 in the example represented, is connected via capacitor 26 directly to the clock input of flip-flop 14, and inverter 27 to clock input H of flip-flop 15.

The second phase L2 in the example represented is connected via input wire 3 of the apparatus to the R reference terminals of the two flip-flops 14 and 15, on the one hand, and to the D data inputs of flip-flops 14 and 15, via device 29, on the other, the function of which is to apply the signal representing the positive or negative sign, i.e., the logic value, of the voltage existing between phase L2 and ground 8, as will be explained below. The function of capacitor 26 in input wire 4 is to compensate for the phase shift introduced by capacitor 6 for connection to ground via user 7.

The operation of apparatus 1 according to the invention and the different steps of the process implemented by said apparatus will be described below with reference to FIGS. 2A and 2B.

FIG. 2A concerns the case represented in FIG. 1 in which it is a matter of determining the sign of the phase angle between the two phases L1 and L2. For the purpose of simplification, the phase signals normally of sinusoidal form are represented by signals varying linearly in time. Given that in FIG. 1 the signal of phase L2 serves as voltage reference which is applied to the R reference terminals constituting the internal ground of the apparatus, signal SL2 of phase L2 is shown as a constant, and signal ST representing ground is periodic and constitutes an alternating signal with respect to reference signal SL2. Signal SL1 of phase L1 applied via capacitor 26 to clock inputs H of D flip-flop 14 and D flip-flop 15 also constitutes an alternating signal with respect to reference signal SL2.

Flip-flops 14 and 15 thus receive three signals, namely a first signal SL1 at clock inputs H, a second signal formed by signal SL2 serving as reference and applied to reference and internal ground input R, and a third signal SD for identification of the phase of second signal SL2 with respect to ground 8, which is positive or negative with respect to ground. This third signal is applied to the D data inputs of the flip-flops.

FIG. 2A also shows the time profile of signal SD. It is observed that this signal represents a logic state 0 or 1 depending on whether the third signal ST is positive or negative with respect to reference signal SL2. FIG. 2A also illustrates clock signals SL1 applied to input H of flip-flop 14, and signal SL1', inverted by inverter 27 with respect to signal SL1, applied to clock input H of flip-flop 15.

It should be noted that the process only requires the use of one flip-flop, namely flip-flop 14, where flip-flop 15 constitutes an additional advantage, as will be explained below.

Given that the characteristic of a D flip-flop is to transfer at its Q output the information present at D data input upon appearance at the clock input of an event, such as the zero-crossing in the present case, of signal SL1, the Q output of flip-flop 14 indicates the sign of the phase angle between phase signal SL1 and phase signal SL2. Indeed, as seen clearly in FIG. 2A, the sign of the phase angle of signal SL1 with respect to signal SL2 changes at points A and B, becoming positive and negative, and it is at these points A and B where the clock signal at clock input H changes, causing the appearance at the Q output of the logic states of data input SD, which are different at points A and B. The logic state at the Q output determines whether or not indicator light 20 is lit, thus indicating the phase sign and the direction of rotation between phases L1 and L2 of the three-phrase system.

Given that flip-flop 15 receives a clock signal which is inverted with respect to the clock signal applied to flip-flop 14, the logic state at its Q output is different with respect to the output signal of flip-flop 14.

The two flip-flops 14 and 15 are provided in order to make possible a confirmation of the interpretation of the input signals. The XOR-gate 17, which is inserted between flip-flops 14 and 15 and display device 19, prohibits any erroneous application of two simultaneously-lit indicator lights.

The signals coming from the two phases being reliable, in case of poor coupling of the third in connection with the ground, the two flip-flops would be in the same state, and neither indicator light 20, 21 would be activated. In contrast, the inversion of the clock signals at flip-flops 14 and 15 allows one indicator light to be lit for the forward direction of rotation and the other to be lit for the opposite direction of rotation.

FIG. 2B illustrates the case in which the first signal serving as clock signal for the flip-flops is signal SL1. Present on phase L3 is the signal serving as reference and signal SL3.

Because one input is capacitively coupled to ground, the testing apparatus according to the invention can serve, by means of circuit 29, to detect the presence of the phases in opposition to neutral. This input circuit is thus common to the phase detection and to the identification of the direction of rotation of the phases.

Single-pole, single-throw switch 24, in the form of a pushbutton, is placed in the vicinity of capacitive sense element 6 of the ground signal, where it is intended that the user place his finger. If the push-button is not closed, the circuits for excitation of indicator lights 20, 21 are open, and the indicator lights are thus kept from lighting.

Single-pole, single-throw switch 24, when closed, is also used to reset the two flip-flops 14 and 15 via a connection of its terminal connected to the circuits at reset input Rz of the flip-flops in the manner represented in FIG. 1.

It emerges from the description of the invention just given that the main aspects of the invention lie in the use of the potential of one phase as reference and as a capacitive connection for the other signals, and application of this principle to a system for identification of the presence of phases using a common circuit.

The invention claimed is:

1. A process for identification of direction of rotation of two periodic electrical signals present on two electrical conductors of a multiple-phase voltage system, including:
    sampling first and second signals from the two conductors through first and second wires, respectively, with a connection to ground of only the first wire through a person;
    shifting the phase of the second signal to compensate for a phase shift introduced by the connection to ground of the first wire through the person;
    determining the direction of rotation from the first and second signals, the first signal serving as a voltage reference, by producing a rotation direction signal representing the direction of rotation determined; and
    producing a visual indication of the direction of rotation determined, using the rotation direction signal.

2. The process according to claim 1, including determining the direction of rotation during zero-crossing of a voltage between the two signals.

3. An apparatus for identification of direction of rotation of two periodic electrical signals comprising:
    a first wire for sampling of a first phase signal as a reference;
    a second wire for sampling a second phase signal;
    a connection to ground of the first wire completed by a user of the apparatus;
    an input circuit which receives the second phase signal and:
    a capacitor connected in the second wire and to the input circuit, compensating the second phase signal for a phase shift introduced by the connection to ground of the first wire through the user; and
    at least one first device for producing a signal representative of the direction of rotation of the first and second phase signals using the first phase signal as a reference for the second phase signal.

4. The apparatus according to claim 3, wherein the first device comprises an input for receiving the first phase signal serving as a reference, an input for receiving of the second signal, after phase shifting, and an input D for receiving a signal representative of the sign of the reference signal with respect to ground.

5. The apparatus according to claim 4, including a second device for display of the direction of rotation of the first and second phase signals.

6. The apparatus according to claim 5, comprising a second D flip-flop, connected in parallel with the first D flip-flop, having a clock input receiving the second phase signal, after inversion, for confirming the direction of rotation provided by the first D flip-flop.

7. The apparatus according to claim 6, including an XOR-gate connected between the first and second D flip-flops and the device for display to prohibit an erroneous indication of the direction of rotation.

8. The apparatus according to claim 3, wherein the device comprises a first D flip-flop having a reference input receiving the first phase signal, a clock input receiving the second phase signal, after phase shifting, and a data input receiving a sign signal representative of the sign of the reference signal with respect to ground, a signal at an output of the flip-flop indicating the direction of rotation of the first and second phase signals.

9. The apparatus according to claim 8, wherein the connection of the first wire to ground completed through a user of the apparatus comprises a metal element inside a housing of the apparatus, spaced from a wall of the apparatus, and a contact zone on an exterior surface of the housing at the metal element, a gap between the metal element and the wall serving as a dielectric.

10. The apparatus according to claim 9, comprising a second device for establishing the sign signal representative of the sign of the first phase signal with respect to ground and for application of the sign signal to the data input for establishing the direction of rotation.

11. The apparatus according to claim 10, for establishing the sign signal identifying existence of the first phase signal.

12. The apparatus according to claim 11, comprising a single-pole, single-throw switch for display of the direction of rotation, the switch being closed when the user touches the contact zone of the housing of the apparatus.

13. The apparatus according to claim 3 wherein no connection to ground completed by a user of the apparatus is provided for the second wire.

14. A process for identification of direction of rotation of two periodic electrical signals present on two electrical conductors of a multiple-phase voltage system, including:

sampling first and second signals from the two conductors through first and second wires, respectively, with a connection to ground of the first wire through a person;

shifting the phase of the second signal to compensate for a phase shift introduced by the connection to ground of the first wire though the person; and determining the direction of rotation from the first and second signals, the first signal serving as a voltage reference, with only the first wire having a connection to ground through the person, by producing a rotation direction signal representing the direction of rotation determined, and producing an indication of the direction of rotation determined, using the rotation direction signal.

* * * * *